United States Patent [19]
Cord et al.

[11] Patent Number: 5,292,394
[45] Date of Patent: Mar. 8, 1994

[54] APPARATUS FOR LARGE-AREA IONIC ETCHING

[75] Inventors: Bernhard Cord, Alzenau; Helmut Rauner, Nidderau, both of Fed. Rep. of Germany

[73] Assignee: Leybold Aktiengesellschaft, Hanau, Fed. Rep. of Germany

[21] Appl. No.: 881,530

[22] Filed: May 12, 1992

[30] Foreign Application Priority Data

Nov. 13, 1991 [DE] Fed. Rep. of Germany ....... 4137257

[51] Int. Cl.$^5$ .............................................. C23F 1/02
[52] U.S. Cl. .................... 204/298.39; 118/723 E; 156/643; 204/298.31; 204/345; 204/298.02; 204/298.15
[58] Field of Search ................ 156/345, 643; 118/723; 204/298.31, 298.34, 298.02, 298.15

[56] References Cited

U.S. PATENT DOCUMENTS 4,425,210 1/1984 Fazlin ..................................... 204/19

FOREIGN PATENT DOCUMENTS 0323620 of 1989 European Pat. Off. .
0327253 of 1989 European Pat. Off. .
55-12733 1/1980 Japan ............................. 204/298.14
2026369 of 1980 United Kingdom .

*Primary Examiner*—Asok Pal
*Attorney, Agent, or Firm*—Felfe & Lynch

[57] ABSTRACT

An evacuable tank having gas inlet and gas outlet openings, with at least one large-area anode at ground potential and a cathode provided as a substrate holder disposed substantially parallel thereto and connected to a high-frequency voltage source. The anode surface has step-shaped areas each being spaced at a different distance from the cathode in order to maintain a uniform ion concentration and therefore a uniform plasma.

10 Claims, 4 Drawing Sheets

APPARATUS FOR LARGE-AREA IONIC ETCHING

BACKGROUND OF THE INVENTION

The invention relates to an apparatus for large-area, uniform ionic etching by means of a vacuum apparatus with a tank having gas inlet and gas outlet openings, and having at least one large-area anode at ground potential and a cathode disposed substantially parallel thereto, which is provided as a substrate holder and is connected with a high-frequency voltage source.

Apparatus which are suited for ionic etching and are operated within vacuum apparatus and in which sputtering processes can also be performed, have long been known. At this point only two printed disclosures DE-22 41 229 C2 and DE-21 49 606 will be referred to, in which apparatus are described which permit substrate coating by cathode sputtering and, by a mere reversing of the polarity of the electrodes, also permit ionic etching.

In DE-22 41 229 C2, a so-called closed system is described for the ionic etching of substrates, within which a plasma forms which is necessary for ablation of material on the substrate and is largely surrounded by the electrode surfaces. No constant gas exchange takes place within the plasma volume. The maintenance of a stable plasma within the closed etching chamber, however, requires a highly precise mechanical enclosure, i.e., a highly accurate positioning of the electrode surfaces while allowing for precisely maintained spacing requirements, for one thing, and for another thing a precise establishment of the potential conditions between the grounded cathode on which the substrate to be etched is mounted, and the anode above it.

Also, for the uniform ablation of material from the substrate surface a very uniform distribution of the plasma density over the substrate is necessary. In connection with the prevailing potential gradient,, however, very different etching rates can establish themselves on the substrate surface on the basis of local differences in the parameters determining the etching process (e.g., plasma density, electrode spacing and voltage ratio).

With the known etching apparatus, as described in the above disclosures, for example, substantially uniform etching rates can be achieved on disk-shaped substrate bodies with a diameter of up to 150 mm. Larger substrate surfaces, however, cannot be treated by etching technology with the uniformity described, because a lower rate of ablation occurs, especially at the marginal areas of the substrate, than in the middle area of the substrate. This is mainly due to the fact that the plasma thins out considerably at the marginal areas of the substrate due to plasma efflux.

SUMMARY OF THE INVENTION

The invention is addressed to the problem of improving an apparatus for large-area, uniform ion etching within a vacuum enclosure having gas inlet and gas outlet openings, to the effect that the maintenance of a stable plasma within the tank housing will be simplified and the uniformity of the ablation rate can be assured even in the case of substrates of larger area than the substrates that can be handled with prior art etching apparatus.

In accordance with the invention, an apparatus is provided for large-area, uniform ionic etching within a vacuum enclosure with gas inlet and gas outlet openings, having at least one large-area anode that is at ground potential and a cathode disposed substantially parallel thereto which is provided as a substrate holder connected to a high-frequency voltage source, such that the anode surface has step-like areas each of which is at a different distance from the cathode.

The principle of ionic etching by means of a vacuum chamber is based on the fact that inert gas is introduced between two electrode surfaces of which the cathode represents the negative pole bearing the substrate and the other represents the anode which is disposed face-to-face opposite the cathode. Usually the gas is argon gas. In addition, a high-frequency voltage is applied to one of the two electrodes so that the inert gas fed between the electrodes is dissociated and forms a stationary plasma. The positive argon ions thus created are accelerated by electrostatic attraction toward the negatively charged substrate surface and upon colliding with the substrate surface they dislodge a certain amount of substrate material according to their kinetic energy and the surface energy conditions of the substrate. In an open system in which a gas stream is maintained parallel to the substrate surface, the substrate particles sputtered away are thus deposited on the anode or, if gaseous compounds form, they are removed from the plasma volume in the gas stream, so that the chemical composition and, in connection therewith, the electronic conditions within the plasma cloud are sustained unaltered.

Basically, the etching rate is governed according to the number of argon ions that strike the substrate surface per unit time, which is governed principally according to the number of ionized argon atoms situated above the substrate surface. At a given pressure of the argon gas present in the apparatus and a given high voltage a plasma burns between the cathode and the counterpotential only when the distance between the two potentials is sufficiently great. The reason for this is that ions and electrons undergo collisions on the way between the two potentials, in which new ions and electrons are produced. If the number of collisions is too small, for example at excessively low pressure or too short a distance between the two potentials, the ion-electron concentration is too low and the plasma is extinguished.

If conversely it is desired to prevent a plasma from burning between two surfaces of which one is carrying a high voltage, these surfaces must be brought so close together than only few electron-ion pairs are formed. Just this consideration already shows that, by varying the distance between the confronting electrodes, one can have a precisely variable control parameter for the purpose of being able arbitrarily to select the etching rate on the substrate surface.

The invention will be explained below by way of example, without restricting the general idea of the invention, with the aid of embodiments and with reference to the drawing, to which reference is expressly made with regard to the disclosure of all details of the invention which are not further explained in the text.

DETAILED DESCRIPTION OF THE PREFERRED EMBODIMENT

Figure 1:
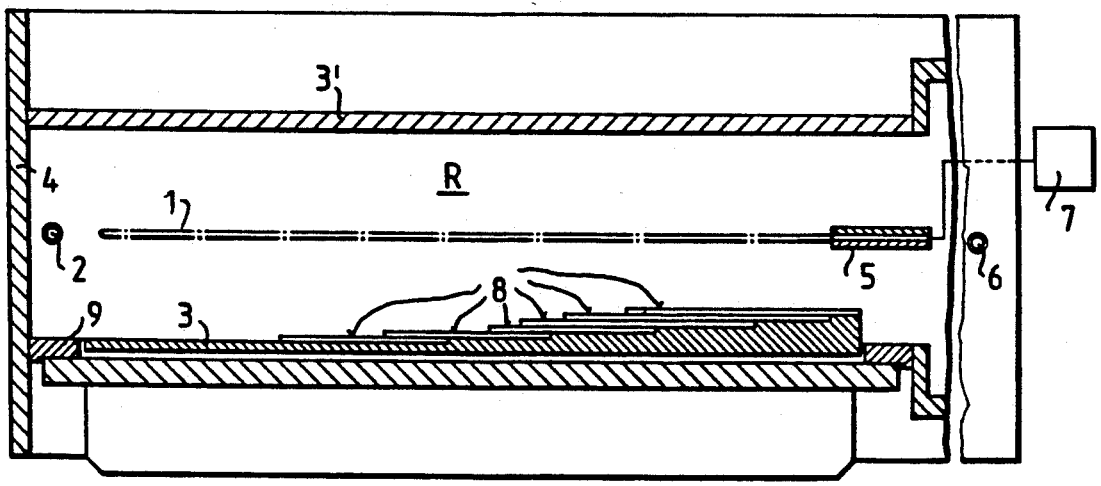
FIG. 1 is a side section through a tank enclosure having electrodes according to the invention.

FIG. 1 shows a centrally disposed, large area electrode 1 (the cathode) which is supplied with high voltage through a special high-frequency adapting network 5 with a radiofrequency source 7. Opposite it, within the tank enclosure 4, is a stepped counterelectrode 3 (the anode) which is preferably at ground potential. The cathode 1 is coupled to the radiofrequency source 7 by a condenser in network 5, but otherwise it is insulated from the ground potential, so that the cathode 1 can have a potential different from zero against the ground potential. Furthermore, the cathode 1 has a smaller surface area than the anode 3 and the tank enclosure 4, so that the cathode 1 is always negatively biased when a plasma is ignited in the tank. Through a gas inlet valve 2 argon gas enters into the interior of the tank enclosure, flows over the electrode arrangement, and is pumped out again through an appropriately provided gas outlet valve 6 by a vacuum pump (not shown). The gas inlet 2 into the tank R is controlled by an additionally attached flow meter (also not shown). The working pressure establishing itself in the tank amounts to between $10^{-3}$ and $10^{-2}$ hPa. On account of the high voltage applied between the electrodes 1 and 3, the argon atoms in the space between the electrodes are ionized and accelerated against the surfaces of substrates mounted to cathode 1. There, on the basis of their high kinetic energy in the form of collision processes, the ions dislodge substrate particles. These substrate particles are either deposited on the confronting anode or, if they form a gaseous compound with a reactive gas added, they are removed from the tank enclosure by pumping. The open construction with steady gas infeed and removal consequently assures a largely constant gas composition in the tank enclosure.

The step-like arrangement of the etching anode 3 is designed so that, in the configuration represented in FIG. 1, it is farthest away from the cathode 1 in the area of the gas inlet, since there the argon atoms freshly introduced in the tank enclosure first have to be ionized in order to contribute to the etching process. Not until after a minimum time of stay between the electrode plates are the argon atoms ionized by collision processes, and the result is that the argon ion concentration in the area of the gas inlet is lower than in the area of the gas outlet. Furthermore, it is known that the etching rate depends on the working pressure, so that, due to locally varying working pressures, different etching rates can occur, e.g., in the area of the gas inlet or outlet. To avoid these undesirable effects and achieve a uniform etching rate all over the substrate surface, the distance between the electrodes is reduced in areas of increasing argon ion concentration, as already described. This leads finally to a stepped structure of the etching anode, as represented in FIG. 1.

Figure 2:
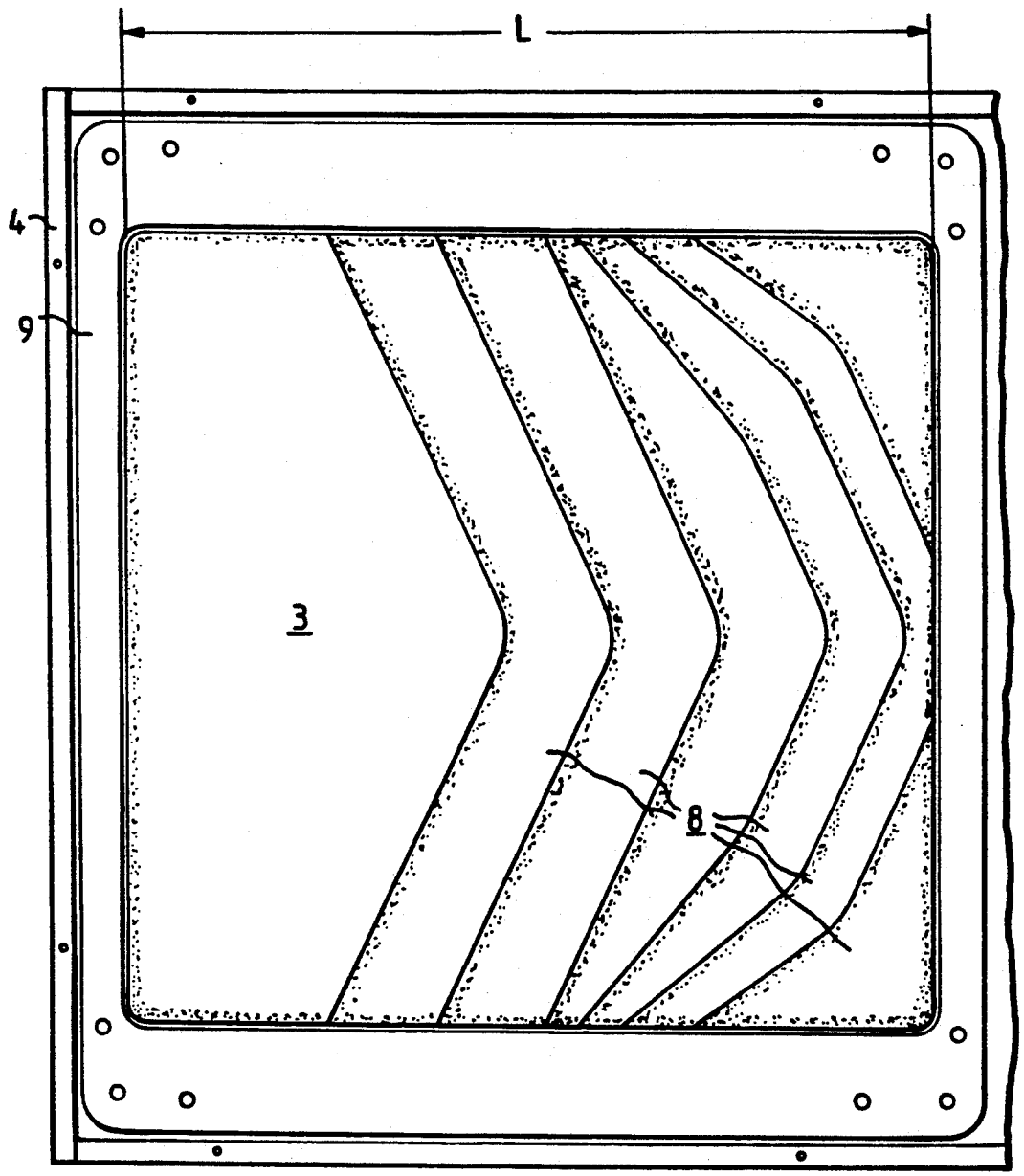
FIG. 2 is a plan view of the stepped anode of FIG. 1.

FIG. 2 represents a plan view of the anode's broad-area step structure shown in cross section in FIG. 1. The step-stair configuration of the surface of the anode 3 produces step-like areas 8 which in FIG. 3 are easily separated from one another by "elevation lines." A frame 9 surrounding the square anode 3 of the edge length L provides for an appropriate positioning of the anode 3 within the tank 4.

Figure 3:
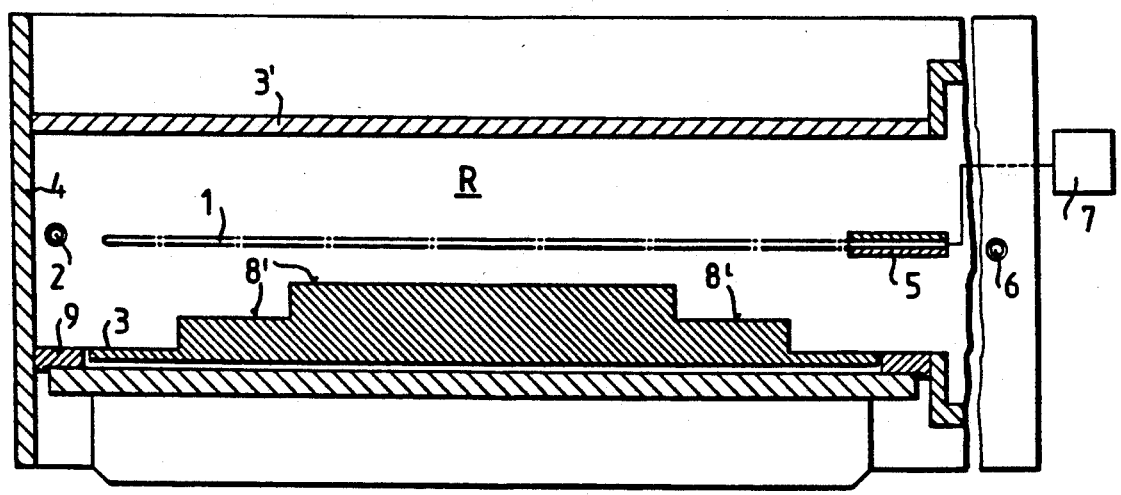
FIG. 3 is a side section through a tank enclosure having an alternative electrode according to the invention.

Different stepped arrangements are of course conceivable, FIG. 3 show an arrangement having a zenith in the middle part of the electrode and dropping toward the margins. It has been learned that the plasma thinning especially in the marginal areas can be reduced if the electrode spacing is increased step-wise toward the marginal areas. The plasma thinning can thus be counter acted by a stepped pyramid-shaped anode structure having any number of steps 8'.

Basically, with the configuration of the etching anode according to the invention, the local etching rate can be set individually by varying the electrode spacing. Thus it is possible for the first time to etch square substrate surfaces with a side length of up to 50 cm to a uniform extent heretofore unachievable.

Figure 1A:
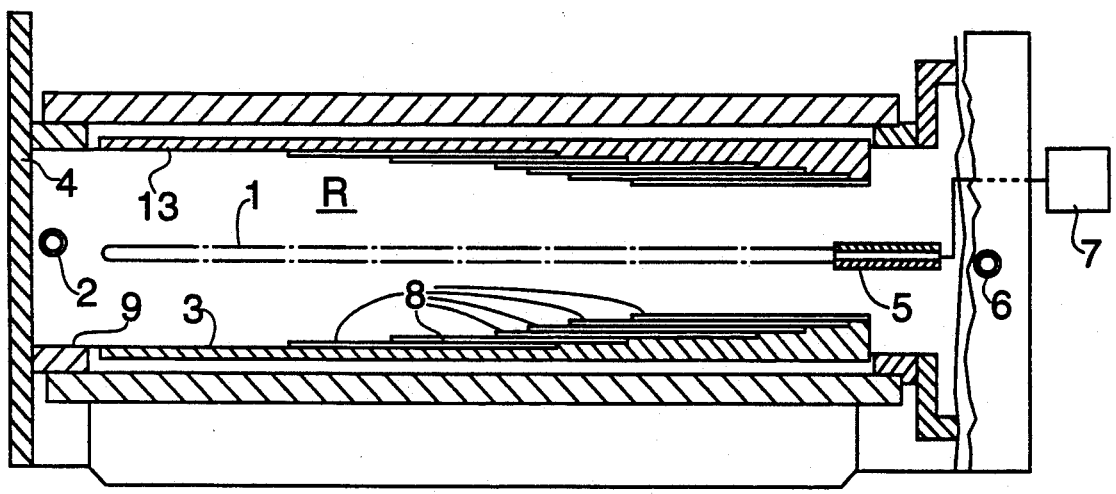
FIG. 1A is a side section through a tank enclosure having two stepped anodes.

A planar anode 3' (FIGS. 1 and 3) is provided opposite anode 3 and can likewise be provided with steps if etching is to be performed on a substrate or substrates mounted to that side of the cathode 1. FIG. 1A illustrates a second stepped anode 13 opposite from anode 3.

The production of semiconductor components in large numbers requires that the process be conducted on a mass-production scale. To be able to change over from one etching batch to the next as fast as possible, the cathode with the substrates fastened on it is movably mounted so that it can be rolled into the etching chamber. This considerably facilitates changing the substrates and provides for a quite optimal utilization of the etching apparatus, which ultimately reduces the cost of production. With the apparatus according to the invention etching technology can be advanced such that large-area substrates can be processed uniformly in the desired manner at lower cost.

We claim:

1. Apparatus for ionic etching of a large area of a substrate, comprising
    an evacuable tank enclosure,
    a planar cathode provided as a substrate holder in said enclosure and connected to a high frequency voltage source,
    an inlet for introducing a gas to be ionized to said enclosure,
    an outlet for removing said gas from said enclosure, and
    a first anode situated between said inlet and said outlet, said anode having continuous surface which is stepped to form planar areas facing said cathode substantially parallel to said cathode, the distance between said surface and said cathode decreasing from said inlet toward said outlet, said anode being at group potential.

2. Apparatus as in claim 1 wherein said cathode is shaped to hold a square substrate having sides of up to 50 cm in length.

3. Apparatus as in claim 1 wherein said cathode and said anode are spaced at maximum distance apart in the vicinity of said inlet, and a minimum distance apart in the vicinity of said outlet.

4. Apparatus as in claim 1 wherein said planar areas are spaced from said cathode so that a uniform plasma is formed over the area of the cathode.

5. Apparatus as in claim 1 further comprising a second anode facing said first anode so that said cathode is situated midway between said first and second anodes.

6. Apparatus as in claim 1 wherein said anode has a middle area surrounded by marginal areas, said planar areas being stepped so that said middle area is closer to said cathode than said marginal areas.

7. Apparatus as in claim 1 wherein said inlet and said outlet are situated adjacent respective opposite sides of said cathode.

8. Apparatus as in claim 1 further comprising a high-frequency adaptor network connected between said high frequency voltage source and said cathode.

9. Apparatus as in claim 1 wherein said high frequency power source has a variable power output.

10. Apparatus as in claim 5 wherein said second anode is situated between said inlet and said outlet, said second anode having a continuous surface which is stepped to form planar areas facing said cathode substantially parallel to said cathode, the distance between said anode and said cathode decreasing from said inlet toward said outlet, said anode being at ground potential.

* * * * *